United States Patent [19]

Isham et al.

[11] Patent Number: 5,583,442
[45] Date of Patent: Dec. 10, 1996

[54] DIFFERENTIAL VOLTAGE MONITOR USING A BRIDGE CIRCUIT WITH RESISTORS ON AND OFF OF AN INTEGRATED CIRCUIT

[75] Inventors: Robert H. Isham, Flemington; Stanley F. Wietecha, So. Boundbrook, both of N.J.

[73] Assignee: Harris Corporation, Melbourne, Fla.

[21] Appl. No.: 192,398

[22] Filed: Feb. 3, 1994

[51] Int. Cl.$^6$ .................................................. G01R 17/00
[52] U.S. Cl. ........................... 324/610; 324/706; 324/720; 323/281
[58] Field of Search .................................. 323/365, 367, 323/281, 315; 324/610, 706, 705, 713, 720, 721, 725; 327/65, 513, 538

[56] References Cited

U.S. PATENT DOCUMENTS

| | | | |
|---|---|---|---|
| 4,375,596 | 3/1983 | Hoshi | 327/541 |
| 4,868,482 | 9/1989 | O'Shaugnessy et al. | 323/313 |
| 5,079,497 | 1/1992 | Barbu et al. | 323/281 |
| 5,172,017 | 12/1992 | Schmidt | 327/538 |
| 5,300,877 | 4/1994 | Tesch | 323/313 |

Primary Examiner—Ernest F. Karlsen
Assistant Examiner—Christopher M. Tobin
Attorney, Agent, or Firm—Joel I. Rosenblatt

[57] ABSTRACT

A differential voltage monitor is shown using a resistive bridge to produce a sample value representing that differential voltage. A portion of the resistive bridge is located on an IC and a portion is external to the IC. The object is to compare the differential voltage with a reference, producing a logic signal at a threshold level. The threshold level serving as a reference and the sample valve representing the differential voltage are made to be equally dependent on the bridge components located on the IC. In this way, any changes in the IC located bridge resistors compared to the bridge resistors located outside the IC are prevented from affecting the measurement.

18 Claims, 3 Drawing Sheets

DIFFERENTIAL VOLTAGE MONITOR USING A BRIDGE CIRCUIT WITH RESISTORS ON AND OFF OF AN INTEGRATED CIRCUIT

FIELD OF THE INVENTION

This invention relates to the field of measuring voltages, in particular, differential voltages.

BACKGROUND OF THE INVENTION

It is well known to measure voltages, such as differential voltages, having a common mode component. Further, it is known to measure a range of differential voltage using an integrated circuit. Where that range of measured voltage is above the capability or input range of the integrated circuit, it has been known to use a resistor bridge using external resistive components to provide a lower voltage representing that differential voltage within the operating range of the integrated circuit. That representation, a fraction of the voltage to be measured, is then applied to the IC and a signal representative of that measured voltage is obtained.

A problem raised by this known method of measurement outside the range of an IC is the requirement for a resistor bridge using components exterior to the IC. Reduction of the components by inclusion of at least some of the bridge resistors on the IC compromises the measurement. This follows as the ratio of resistors outside the IC to those resistors inside the IC cannot be maintained with consistent accuracy required for the voltage division. This is due to the variation between a) the resistors built on IC's, due to processing and during operation, and b) the resistors external to the IC.

SUMMARY OF THE INVENTION

This invention minimizes the number of components external to an Integrated Circuit (IC), used in measuring a voltage beyond the range or capability of the IC. For example, where a voltage occurs outside an IC and beyond the range of the IC, and where it is desirable to measure that voltage using components on the IC, the inventive principles described here may be applied to make that measurement accurately and with consistency even though the value of the resistors on the IC relative to the value of resistances off the IC, may vary.

For example, in the preferred embodiment a voltage located outside an IC is to be measured. Where this voltage is beyond the range of the IC, a voltage divider is used to derive a representation of that voltage at a lower value, within the IC range. According to the inventive principles, some of the voltage divider components are located on the IC thus reducing the number of components external to the IC. Because of variations in voltage divider element values located on the IC relative to element values outside the IC, the lower representative voltage actually measured by the IC may vary.

The inventive principles as shown in the preferred embodiment solves this problem by providing a reference voltage that compensates for variations in the lower representative voltage caused by variations in the elements located internally on the IC relative to the elements off the IC. In this way, variations in the IC located elements relative to the associated elements located externally to the IC, are compensated and prevented from affecting the measured value.

In the preferred embodiment, a differential voltage is reduced by a voltage divider network to a divided differential voltage level. This divided differential voltage level is translated into a single ended output and compared to a reference voltage. The reference voltage is a portion of the voltage supply VBAT produced through a voltage divider network having elements or components on and off the IC. Comparison of the divided differential voltage level as a single ended output signal with the reference level provides an indication when the differential voltage has changed level and gone above or below the reference voltage level. This indication can be obtained, according to the inventive principles without any change in the measured differential voltage level due to variations between the voltage divider elements on and off the IC by a comparison with a reference level derived from voltage divider components on and off the IC.

Accordingly, the differential voltage which will produce an output signal indicative of a change in state when the differential voltage goes above or below the reference signal can be produced independent of elements on and off the IC.

DETAILED DESCRIPTION OF THE INVENTION

Figure 1:
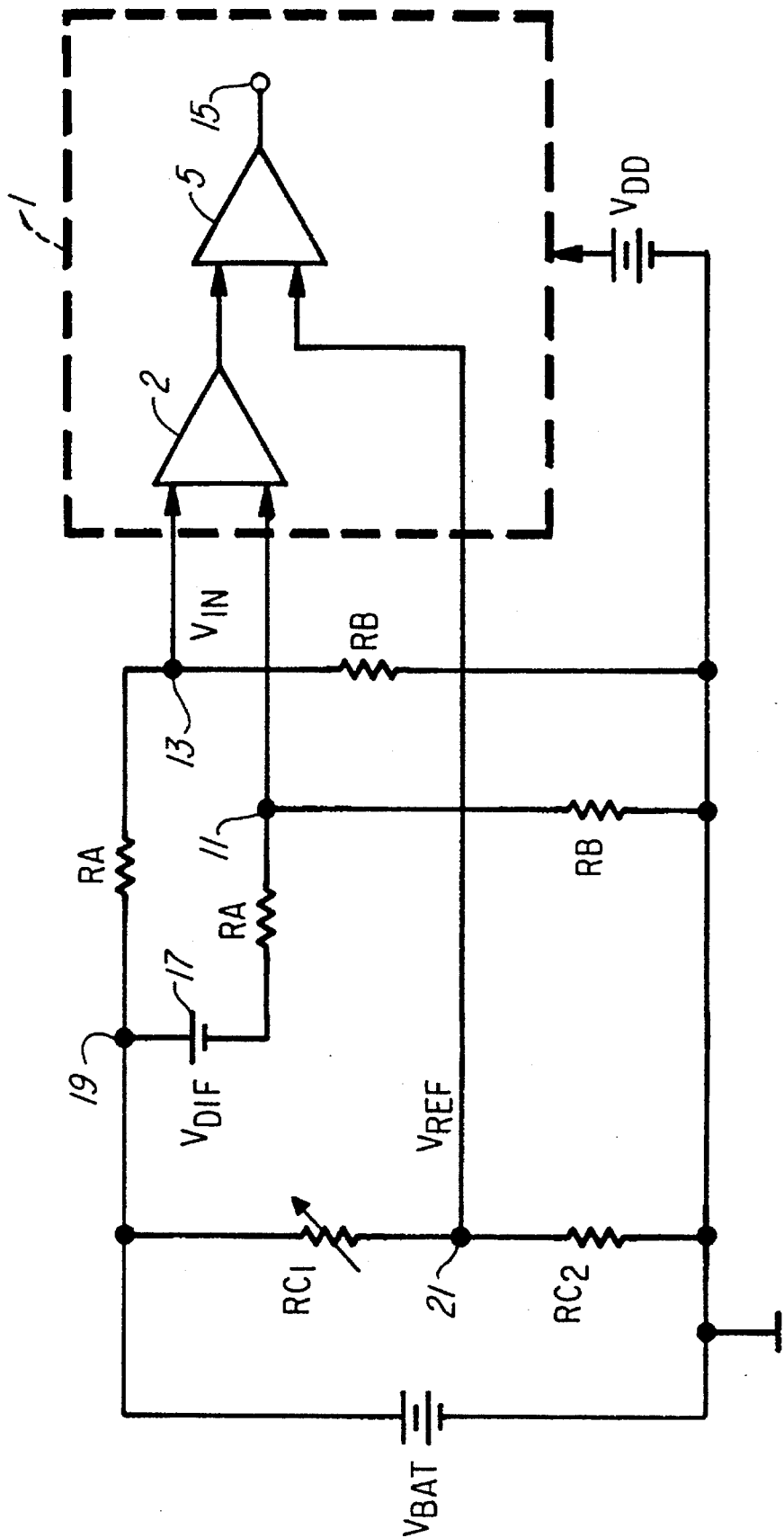
FIG. 1 shows in generalized form the prior art system for measuring a voltage beyond the range of an IC, by the IC.

FIG. 1 shows the prior system for measuring a voltage beyond the range of an IC shown within the dashed line box, 1, by components on the IC. As shown in the preferred embodiment, the voltage to be measured is a differential voltage shown as $V_{DIF}$. Because the common mode component of that voltage, $V_{DIF}$, is higher than the measurement capability of the IC, a lower representative voltage shown as $V_{IN}$ is sampled using the bridge network composed of resistances RA and RB. $V_{IN}$, as is well known, then is applied to a differential to single ended converter 3. The output of that converter 3 is then applied to a comparator 5 which compares a reference voltage to $V_{IN}$ to produce the measurement voltage at terminal 15. The reference voltage $V_{REF}$ is derived using divider network $R_{C1}$–$R_{C2}$. $R_{C1}$ may be an adjustable or fixed resistor.

As is well known, the resistor bridge, composed of the two matched resistors RA and the two matched resistors $R_B$, reduces the common mode voltage at the input of the IC to:

$$\left(\frac{R_B}{R_A + R_B}\right) V_{BAT}$$

The resistor bridge also reduces the differential voltage $V_{DIF}$ to be measured by the ratio:

$$V_{IN} = \left(\frac{R_B}{R_A + R_B}\right) V_{DIF}$$

Where the values of $R_A$ and $R_B$ are maintained in a fixed ratio, the ratio $V_{IN}$ (the representation of $V_{DIF}$ presented to the IC) to $V_{REF}$ will remain constant. If the ratio of $R_A$ to $R_B$ changes, then the ratio of $V_{IN}$ to $V_{REF}$ will change causing an inaccuracy in the measured value at terminal 15.

Where it is desired to minimize components external to the IC1, such as for example, the resistors $R_B$ of the resistance bridge $R_A/R_B$, inaccuracies may occur. In the preferred embodiment, the resistances $R_B$ of the resistance bridge $R_A/R_B$ are placed on the IC, 1, minimizing components off the IC.

As it is not possible in most IC technologies to produce IC internal resistors that match either the initial value or temperature coefficients of external resistors, the solution shown in FIG. 1 would lead to unacceptable accuracy in the measured value at terminal 15.

Figure 2:
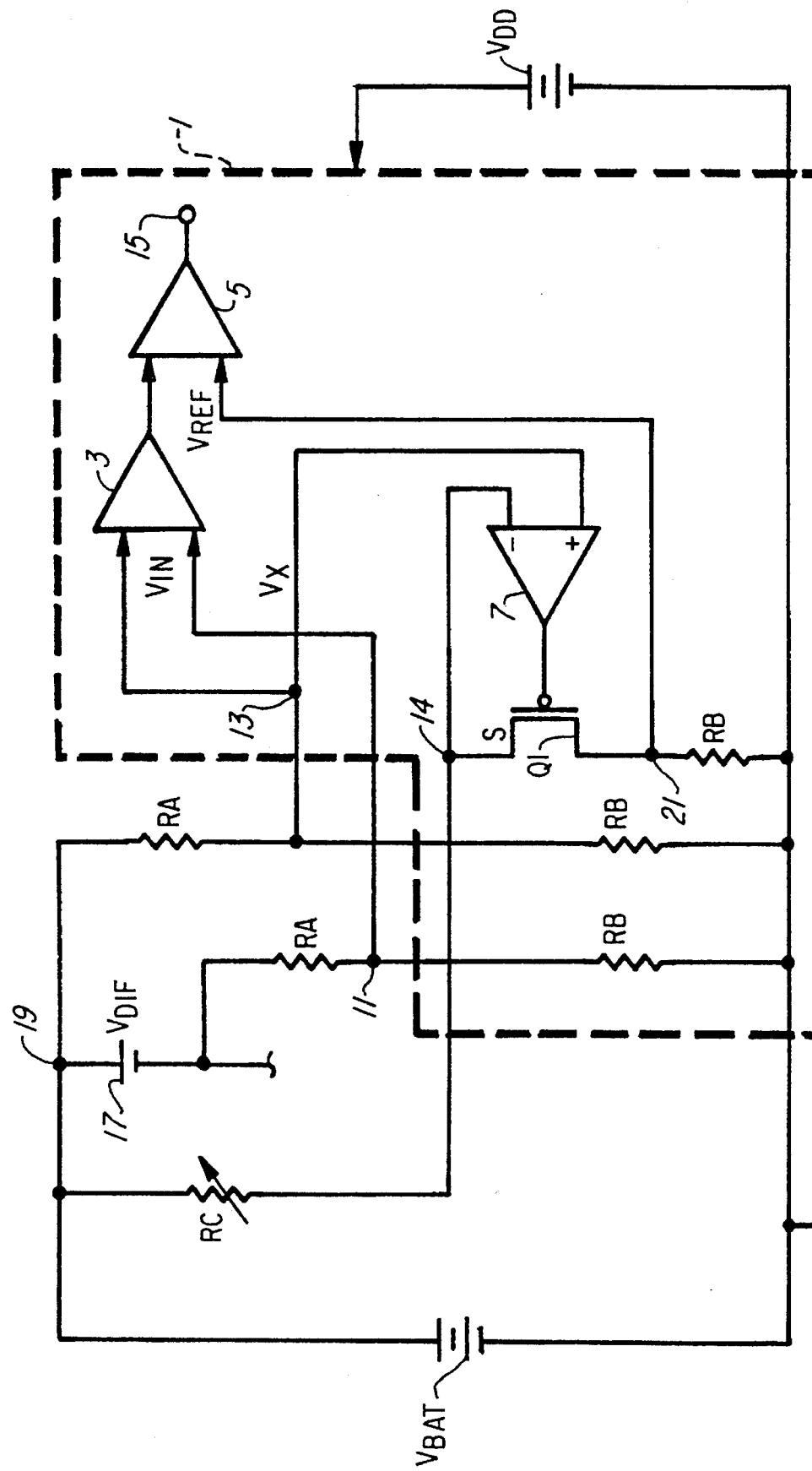
FIG. 2 shows in the preferred embodiment according to the inventive principles, the system for measuring a voltage beyond the range of an IC, using components located on the IC.

The inventive principles with regard to the preferred embodiment are now shown in FIG. 2.

This invention solves the problem of locating at least some of the $R_A/R_B$ bridge resistors on the IC1. The preferred embodiment according to the inventive principles solves the problem by providing a reference voltage $V_{REF}$ that compensates for variations in $V_{IN}$ caused by variations in the bridge resistors $R_B$ located on the IC relative to resistors $R_A$. In the preferred embodiment, $V_{IN}$ is a representative voltage of $V_{DIF}$. In the preferred embodiment the resistance bridge is shown as comprising resistors $R_A$ and $R_B$. Those resistances labeled $R_B$ of the resistance bridge are located on the IC. It is variations in these resistances $R_B$ located on the IC relative to the resistances off the IC, causing variations in the representative voltage $V_{IN}$ that is compensated by the inventive principles as shown in the preferred embodiment.

In FIGS. 1 and 2 the same numerals refer to the same or similar components. A source follower $Q_1$ is shown between $R_C$ and $R_B$.

The differential voltage $V_{IN}$, at IC1 representative of $V_{DIF}$ is:

$$V_{IN} = \left( \frac{R_B}{R_A + R_B} \right) V_{DIF}$$

where $V_{DIF}$ is the differential voltage to be measured and $V_{IN}$ is the representative differential voltage at the input of the IC. As stated above, $V_{IN}$ is a representative voltage of $V_{DIF}$, reduced from $V_{DIF}$ to accommodate the operating capability of the IC1.

$V_X$ is the voltage at node 13 produced by the $R_A/R_B$ voltage divider element connected to VBAT.

$$V_X = \left( \frac{R_B}{R_A + R_B} \right) V_{BAT}$$

Operational amplifier 7, and Q1, shown in the preferred embodiment as a PMOS FET are arranged to force the voltage at the Q1 source at node 14 to be equal to $V_X$ at node 13. The voltage across the resistor $R_C$ then is $V_{BAT}-V_X$:

$$V_{RC} = V_{BAT} \left( \frac{R_A}{R_A + R_B} \right)$$

The current flowing through $R_C$ becomes:

$$I_{Resistor\ C} = \frac{V_{BAT}}{R_C} \left( \frac{R_A}{R_A + R_B} \right)$$

This current $I_{RC}$ is applied to node 21 and to a resistor with the value $R_B$ to develop the voltage reference $V_{REF}$.

The voltage reference VREF has the value:

$$V_{REF} = V_{BAT} \frac{R_B}{R_C} \left( \frac{R_A}{R_A + R_B} \right)$$

$V_{REF}$ appears at the node 21 and is applied to one of the inputs of comparator 5. The IC1 then compares $V_{IN}$, the representative of differential voltage $V_{DIF}$ against $V_{REF}$.

Comparator 5 switches its output state at the point where its two inputs are equal, that is $V_{IN}=V_{REF}$.

If the equations shown above for $V_{IN}$ and $V_{REF}$ are set equal to each other the resulting relationship of $V_{DIF}$ to $R_A$, $R_C$, and $V_{BAT}$ shown below as:

$$\left( \frac{R_B}{R_A + R_B} \right) V_{DIF} = V_{BAT} \frac{R_B}{R_C} \left( \frac{R_A}{R_A + R_B} \right)$$

This reduces to:

$$V_{DIF} = \frac{R_A}{R_C} V_{BAT}$$

Accordingly, the internal resistance, $R_B$, is effectively removed from the process and the relation of $V_{DIF}$ to $V_{BAT}$ which causes comparator 5 to switch is a function of external resistors $R_A$ and $R_C$. Accordingly, $R_B$ the internal resistor, does not affect the differential voltage measurement.

Figure 3:
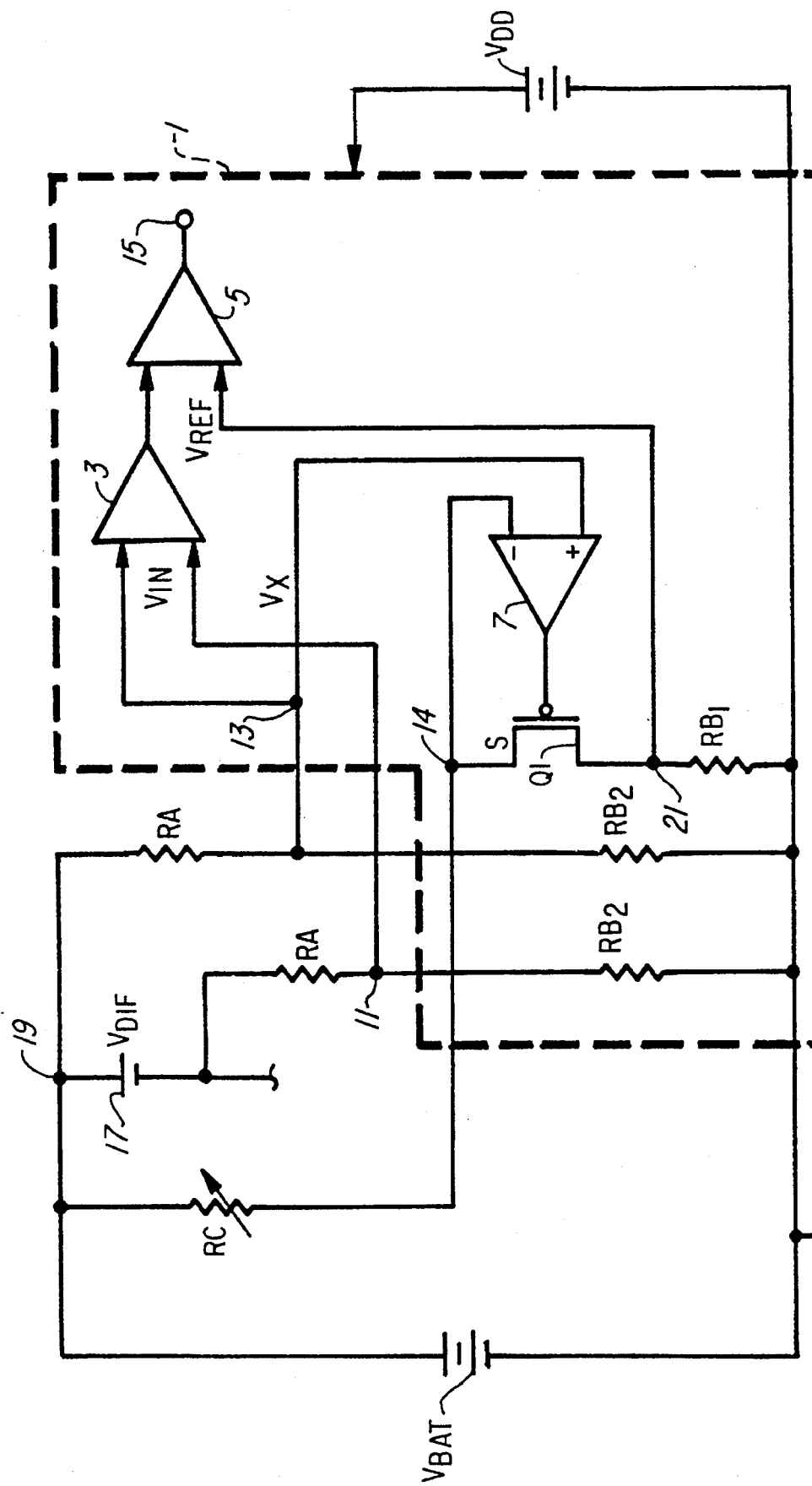
FIG. 3 shows an alternative embodiment wherein the resistor between the transistor Q1 and ground differs from RB.

Resistor RB located between Q1 and ground can be a different value then the value of the other RB resistors. For example as shown in FIG. 3, Resistor $RB_1$ may be a different value than the two resistors $RB_2$. According to the principles of the invention, as disclosed for the preferred embodiment $RB_1$ can be related to $RB_2$ by a definite ratio. That ratio can be designated K, that is $R_{B1}=KR_{B2}$.

If RB1 and RB2 are substituted for RB and VIN set equal to $V_{REF}$, then $$\left( \frac{R_{B2}}{R_A + R_{B2}} \right) V_{DIF} = V_{BAT} \cdot \frac{R_{B1}}{R_C} \left( \frac{R_A}{R_A + R_{B2}} \right)$$

this reduces to:

$$V_{DIF} = \frac{R_{B1}}{R_{B2}} \cdot \frac{R_A}{R_C} \cdot V_{BAT}$$

substituting $$R_{B1} = K R_{B2}, V_{DIF} = K \cdot \frac{R_A}{R_C} \cdot V_{BAT}$$

As shown $V_{DIF}$ is dependent on $R_A$ and $R_C$ and independent of $R_B$. The multiplier K permits flexibility in selecting components and $R_{B1}$ need not be made equal to $R_{B2}$.

One application of the inventive principles may be to measure the voltage drop across an electrical component. For example, the electrical component may be an NDMOS. The voltage across that NDMOS may be the $V_{DIF}$ input. VBAT, representing the voltage supply may have very high positive and negative transients. This circuit may be used to measure excess current flow in the NDMOS by monitoring the voltage drop across the NDMOS. $R_C$ may be used to adjust for a desired threshold level representative of a threshold level for $V_{DIF}$, for example.

According to the inventive principles, a voltage outside the range of an IC may be measured in comparison with a reference using a divider network to produce a representative value of that voltage and where a portion of that divider network is located on the IC.

As shown in the preferred embodiment and according to the inventive principles, a signal can be produced at terminal 15 indicative of a change of state where such change of state may represent a signal crossing a trip point or threshold level. In the case of the preferred embodiment, the trip point is a threshold level for the differential input voltage $V_{DIF}$. The trip point may be set as shown above as a percentage of $V_{BAT}$ by setting the ratio of $R_A$ and $R_C$ accordingly.

$V_{IN}$ is a divided differential voltage level produced from $V_{DIF}$ through the resistive voltage divider $R_A$–$R_B$. The amplifier 3 produces a single ended output to operational amplifier 5 indicative of the level of $V_{IN}$. Operational amplifier 5 has very high gain and operates as a comparator having as a second input $V_{REF}$. $V_{REF}$ is derived through a voltage divider network having components off and on the IC, similar to the voltage divider components used to produce $V_{IN}$. Accordingly, any variations in the voltage divider network having components on and off the IC and used to produce $V_{REF}$ and the voltage divider components on and off the IC used to produce $V_{IN}$ and representative of $V_{DIF}$, compensate, removing the effect of such variations on the measurement. Accordingly, by proper adjustment of $R_C$, a threshold level or trip level may be established for $V_{DIF}$ as a percentage of $V_{BAT}$. A state change signal may be produced at terminal 15 whenever $V_{DIF}$ changes value and crosses that said threshold level.

As would be apparent to those skilled in the art comparative 15 is a high gain amplifier suitable for producing a state change signal.

The inventive principles may be applied to measuring any voltage requiring a divider network to produce a representative value. The inventive principles are not limited to resistive bridges or to voltage divider resistive elements partially located on an IC, or to the production of a state signal, but may be applied generally to the use of combined circuit elements located off and on the IC and causing variations on an output signal due to variations between the elements on the IC and off the IC.

We claim:

1. A system for setting a reference voltage level for comparison with a representative differential voltage level within the voltage range of an integrated circuit, where the representative differential voltage level is derived from a differential voltage source having a differential voltage level above the voltage range of the integrated circuit, and wherein the differential voltage source is divided by a first voltage divider network, having resistive parts integral with said integrated circuit and resistive parts non-integral with said integrated circuit, and with the reference voltage level being derived from a voltage source divided by a second voltage divider network having resistive parts integral with said integrated circuit and non-integral with said integrated circuit, and for indicating when said differential voltage level crosses a threshold voltage level related to the ratio of said resistive parts non-integral to said integrated circuit and independent of said resistive parts integral with said integrated circuit, comprising:

A. a differential voltage source producing a differential voltage level;

B. a voltage source for producing a source voltage level;

C. said differential voltage source having a terminal connected to a terminal of said voltage source;

D. a first voltage divider network having a set of output terminals and connected to said differential voltage source for producing a representative differential voltage level at said set of output terminals;

E. said first voltage divider network including means for producing at a first of said set of output terminals, a representative source voltage level;

F. said representative source voltage level being produced in accordance with the ratio formed of a resistive part of said first voltage divider network integral with said integrated circuit and with a resistive part of said voltage divider network non-integral with said integrated circuit;

G. a second voltage divider network for producing a reference voltage level;

H. said second voltage divider network having a resistive part non-integral with said integrated circuit and connected to said source voltage, and a resistive part integral with said integrated circuit;

I. said second voltage divider network including driving means connected between said second voltage divider network resistive part non-integral with said integrated circuit and said second voltage divider network resistive part integral with said integrated circuit and having a first junction between said driving means and said second voltage divider resistive part integral with said integrated circuit and a second junction between said driving means and said second voltage divider network resistive part non-integral with said integrated circuit;

J. said driving means including a first input terminal for receiving said representative source voltage level from said first of said output terminals of said first voltage divider network and a second input terminal connected to said second junction of said second voltage divider network for receiving the voltage level at said second junction;

K. a differential to single ended converter, having an input connected to said set of output terminals of said first voltage divider network output terminal for receiving said representative differential voltage, and having an output terminal, and producing a signal indicative of said representative differential voltage level;

L. a comparator having a first input connected to the said output terminal of said differential to single ended converter and a second input connected to the said first junction of said second voltage divider network;

M. said driving means producing a voltage level at said second junction of said second voltage divider network equal to said representative source voltage level and producing a voltage difference across said second voltage divider network resistive part, non-integral with said integrated circuit, equal to the difference between said source voltage and said representative source voltage level at said second junction, and N. said voltage difference producing a first current through said second voltage divider network resistive part non-integral with said integrated circuit and through said second voltage divider network resistive part integral with said integrated circuit and producing a reference voltage level at said first junction;

O. said comparator, responsive to said signal at the output terminal of said differential to single ended converter and to said reference voltage level, producing a state signal when said differential voltage level crosses a voltage level related to the product of the source voltage level and the ratio formed of said resistive parts non-integral with said integrated circuit of said first and second voltage divider networks.

2. The system of claim 1, wherein said representative source voltage is a product of said source voltage and the ratio formed of first voltage divider network, resistive part non-integral with said integrated circuit and said first voltage divider resistive part integral with said integrated circuit.

3. The system of claim 1 wherein said resistive parts integral to said integrated circuit, of said first and second voltage divider networks are related to each other by a constant K.

4. The system of claim 1 wherein: said second voltage divider network resistive part non-integral with said integrated circuit is adjustable.

5. The system of claim 1 wherein said first voltage divider network is a bridge voltage divider.

6. The system of claim 4 wherein: said integrated circuit has a maximum voltage operating range, and said representative differential voltage level and said representative source voltage level is within said maximum voltage operating range.

7. The system of claim 1 wherein said driving means includes:
   a. an operational amplifier;
   b. a field effect transistor;
   c. said operational amplifier having a first input terminal connected to said first of said set of output terminals of said first voltage divider network for receiving said representative source voltage level and a second input terminal connected to said second junction of said second voltage divider network for receiving said voltage level at said second junction;
   d. said operational amplifier having an output terminal connected to the input of said field effect transistor; and
   e. wherein the said second junction voltage level is driven by said driving means to said representative source voltage level.

8. The system of claim 7 wherein:
   said field effect transistor is PMOS transistor and the source terminal of said PMOS transistor is connected to said second junction.

9. The system of claim 1 wherein:
   said comparator produces said state signal independently of the ratio of said resistors integral with said integrated circuit.

10. A system for comparing a differential voltage level with a threshold level using an integrated circuit having a voltage range less than said differential voltage, including:
    a. a differential voltage source producing a differential voltage;
    b. a voltage source producing a source voltage;
    c. an integrated circuit having a maximum voltage range less than said differential voltage or said source voltage;
    d. a first means for voltage dividing including resistive means integral with said integrated circuit and non-integral with said integrated circuit;
    e. a second means for voltage dividing including resistive means integral with said integrated circuit and non-integral with said integrated circuit.
    f. said first means for voltage dividing including means for producing a representative source voltage related to the product of said source voltage and the ratio formed of a resistive means non-integral with said integrated circuit and a resistive means integral with said integrated circuit, and including means for producing a representative differential voltage related to the product of said differential voltage and the ratio formed of a resistive means non-integral with said integrated circuit and a resistive means integral with aid integrated circuit;
    g. said second means for voltage dividing including driving means for driving the voltage across said resistive means non-integral with said integrated circuit to the difference between said voltage source and said representative source voltage and producing a first current in said resistive means non-integral with said integrated circuit of said second means voltage dividing;
    h. said second means for voltage dividing including a resistive part integral with said integrated circuit and connected to said resistive part non-integral with said integrated circuit, for receiving said first current and producing a reference voltage in response to said first current;
    i. said integrated circuit includes means connected to said representative differential voltage and to said reference voltage for producing a signal when said differential voltage crosses a threshold voltage and wherein said threshold voltage is related only to said resistive parts of said first means for voltage dividing and said second means for voltage dividing, non-integral with said integrated circuit, and not related to said resistive parts of said first means for voltage dividing and said second means for voltage dividing, integral with said integrated circuit.

11. The system of claim 10 wherein said resistive part non-integral with said integrated circuit, of said second means for voltage dividing, is an adjustable resistance for varying said threshold voltage level.

12. A system for producing a state signal indicative of a differential voltage level crossing a threshold level, including:
    a. a voltage source producing a source voltage level $V_{BAT}$;
    b. a differential voltage source producing a differential voltage level $V_{DIF}$;
    c. a resistor bridge having resistors $R_B$ integral with an integrated circuit and resistors $R_A$ non-integral with said integrated circuit;
    d. said first resistor bridge having a first terminal set connected to said integrated circuit and producing a voltage $V_x$ at said terminal where $$V_X = \left( \frac{R_B}{R_A + R_B} \right) V_{BAT};$$

e. said first resistor bridge producing a reduced differential voltage $V_{IN}$ at said terminal set, where $$V_{IN} = \left( \frac{R_B}{R_A + R_B} \right) V_{DIF}$$

and $V_{IN}$ and $V_X$ voltage levels are within the voltage operating level of said integrated circuit;
    f. a means for voltage dividing having a first resistor $R_{BI}$ and a second resistor $R_C$ and said first resistor $R_{BI}$ is integral with said integrated circuit and connected to said second resistor $R_C$ and said second resistor $R_C$ is non-integral with said integrated circuit;
    g. said means for voltage dividing including a driving means connected at a first junction to said resistor $R_{BI}$ integral with said integrated circuit and at a second junction to said resistor $R_C$ non-integral with said integrated circuit;
    h. said driving means driving said voltage at said second junction to said voltage $V_X$ and the voltage across said resistor $R_C$ non-integral with said integrated circuit of said means for voltage dividing, to a voltage $V_{RC}$ where $$V_{RC} = V_{BAT} - V_X;$$

i. said voltage $V_{RC}$ producing a current $I_{RC}$ through said resistor non-integral with said integrated circuit of said voltage divider means equal to $$I_{RC} = \frac{V_{BAT}}{R_C} \left( \frac{R_A}{R_A + R_B} \right);$$

j. said current $I_{RC}$ through said resistive means non-integral with said integrated circuit producing a voltage $$V_{REF} = V_{BAT} \frac{R_B}{R_C} \left( \frac{R_A}{R_A + R_B} \right);$$

k. said integrated circuit containing means for comparing, connected to said voltage levels $V_{IN}$ and to $V_{REF}$;

l. wherein said means for comparing changes state when said differential voltage level $V_{DIF}$ crosses a voltage level related to the product of $V_{BAT}$ when $$V_{DIF} = \frac{R_A}{R_C} V_{BAT}$$

13. The system of claim 12 wherein said second resistor $R_{BI}$ of said voltage divider network is related to said resistors $R_B$ of said voltage divider bridge integral with said integrated circuit by a constant K;

and wherein said means for comparing changes state when the voltage level $V_{DIF}$ is equal to $$K \times \frac{R_A}{R_C} V_{BAT}$$

14. A system for measuring a differential voltage using an integrated circuit having a voltage range less than said differential circuit including:

a. a voltage source producing a source voltage level;

b. a differential voltage source producing a differential voltage level;

c. means for producing a reduced differential voltage level within the operating range of said integrated circuit;

d. said means for producing a reduced differential voltage level including means for producing a representative source voltage level within the operating range of said integrated circuit;

e. first resistive means connected to said source voltage;

f. driving means connected to said representative source voltage level and to said first resistive means for driving the voltage across said first resistive means to a first voltage level being the difference between said source voltage level and said representative source voltage level;

g. said first voltage level producing a first current through said first resistive means;

h. a second resistive means connected to said first resistive means for receiving said first current from said first resistive means and producing a reference voltage level in said second resistive means;

i. said first resistive means being non-integral with said integrated circuit and said second resistive means being integral with said integrated circuit;

j. means for producing a signal connected to said first reduced differential voltage level and to said reference voltage level, and producing said signal in response to said reduced differential voltage level crossing said reference voltage level;

k. said means for producing a signal including means for producing said signal related to said first resistive means non-integral to said integrated circuit.

15. A system for measuring a differential voltage using an integrated circuit having a voltage range less than said differential circuit including:

a. a voltage source producing a source voltage level;

b. a differential voltage source producing a differential voltage level;

c. means for producing a reduced differential voltage level within the operating range of said integrated circuit;

d. said means for producing a reduced differential voltage level including means for producing a representative source voltage level within the operating range of said integrated circuit;

e. first resistive means connected to said source voltage;

f. driving means connected to said representative source voltage level and to said first resistive means for driving the voltage across said first resistive means to a first voltage level being the difference between said source voltage level and said representative source voltage level;

said first voltage level producing a first current through said first resistive means;

h. a second resistive means connected to said first resistive means for receiving said first current from said first resistive means and producing a reference voltage level in said second resistive means;

said first resistive means being non-integral with said integrated circuit and said second resistive means being integral with said integrated circuit;

j. means for producing a signal, connected to said differential voltage when said reduced differential voltage level crosses said reference voltage level; and wherein, k. said signal is produced when said differential voltage level crosses a threshold voltage level and said threshold voltage level is proportional to said source voltage level and said first resistive means non-integral to said integrated circuit.

16. The system of claim 15, wherein a. said means for producing a reduced differential voltage level includes a third resistive means non-integral with said integrated circuit and a fourth resistive means integral with said integrated circuit; and b. said threshold signal is proportional to said source voltage level and the ratio formed of said first resistive means and said third resistive means.

17. The system of claim 16, where:

a. said fourth resistive means is related to said second resistive means by a constant K.

18. A system for measuring a differential voltage using an integrated circuit having a voltage range less than said differential voltage and for producing a signal when said differential voltage crosses a threshold voltage including:

a. a voltage source producing a source voltage;

b. a differential voltage source producing a differential voltage;

c. an integrated circuit connected to said source voltage and to said differential voltage;

d. said integrated circuit including first resistive means integral with said integrated circuit;

e. said integrated circuit including a second resistive means non-integral with said integrated circuit;

f. means for producing a threshold voltage connected to said source voltage and said integrated circuit;

g. said integrated circuit including means for producing a signal when said differential voltage crosses said threshold voltage level;

h. said first and second resistive means being connected to said differential voltage source for producing a reduced differential voltage level within the operating range of said integrated circuit; and i. said means for producing said threshold voltage, including means for producing said threshold voltage proportional to said source voltage and said first resistive means non-integral with said integrated circuit, and independent of said second resistive means integral with said integrated circuit.

* * * * *